(12) United States Patent
Chang

(10) Patent No.: US 8,299,469 B2
(45) Date of Patent: Oct. 30, 2012

(54) THIN FILM TRANSISTOR ARRAY PANEL WITH OVERLAPPING FLOATING ELECTRODES AND PIXEL ELECTRODES

(75) Inventor: Jong-woong Chang, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 11/818,628

(22) Filed: Jun. 14, 2007

(65) Prior Publication Data
US 2008/0017886 A1    Jan. 24, 2008

(30) Foreign Application Priority Data
Jul. 18, 2006 (KR) .................. 10-2006-0066945

(51) Int. Cl.
*H01L 27/14* (2006.01)
(52) U.S. Cl. .......... 257/72; 257/223; 257/227; 257/291; 257/292; 257/439; 257/443; 257/655; 257/59; 257/E33.001; 349/129; 349/43; 349/72

(58) Field of Classification Search ............ 257/223, 257/227, 291, 292, 439, 443, 655, 59, 72; 349/129, 43
See application file for complete search history.

(56) References Cited

U.S. PATENT DOCUMENTS

| | | | | |
|---|---|---|---|---|
| 5,151,806 A | * | 9/1992 | Kawamoto et al. | 349/39 |
| 5,847,781 A | * | 12/1998 | Ono et al. | 349/44 |
| 6,525,788 B1 | * | 2/2003 | Nakagawa et al. | 349/44 |
| 6,894,735 B2 | * | 5/2005 | Chae et al. | 349/38 |
| 2005/0230719 A1 | * | 10/2005 | Aoki et al. | 257/291 |

* cited by examiner

Primary Examiner — Marcos D. Pizarro
Assistant Examiner — Eva Yan Montalvo
(74) Attorney, Agent, or Firm — Innovation Counsel LLP

(57) ABSTRACT

According to an embodiment of the present invention, a thin film transistor array panel includes a gate line and a data line insulated from each other on an insulating substrate where the gate line and the data line cross each other to define a pixel region, a thin film transistor (TFT) disposed at an intersection of the gate line and the data line, a floating electrode where at least a portion of the floating electrode overlaps the data line, and a pixel electrode disposed at the pixel region where the pixel electrode is connected to the TFT and overlaps the at least a portion of the floating electrode.

14 Claims, 16 Drawing Sheets

THIN FILM TRANSISTOR ARRAY PANEL WITH OVERLAPPING FLOATING ELECTRODES AND PIXEL ELECTRODES

CROSS-REFERENCE TO RELATED APPLICATION

This application claims priority to Korean Patent Application No. 10-2006-0066945 filed on Jul. 18, 2006 in the Korean Intellectual Property Office, Republic of Korea, the disclosure of which is incorporated by reference in its entirety.

BACKGROUND OF THE INVENTION

1. Field of the Invention

The present invention relates to a thin film transistor array panel, and more particularly, to a thin film transistor array panel that can improve the response time of a liquid crystal display.

2. Description of the Related Art

Liquid crystal displays (LCDs) generally include an upper panel, a lower panel and a liquid crystal material having a dielectric anisotropy injected between the upper panel and the lower panel. Light transmission through the panels is controlled by varying the strengths of the electric fields applied to the upper and lower panels, thereby controlling an orientation of the liquid crystal material and displaying a desired image.

In recent years, a variety of studies have been conducted with the goal of discovering how to increase the response time or speed of a liquid crystal display. Several solutions have been proposed to increase the response speed of liquid crystal, including improvement of driving conditions, changing liquid crystal materials, and changing liquid crystal cell modes. Specifically, the response time may be improved by optimizing a driving voltage, often denoted as an analog source voltage (AVDD), to increase the rise time. However, a consequence of this may be that power dissipation may also increase. Other solutions have been tried including reducing an offset voltage, which shortens the fall time, thereby improving the response speed of the liquid crystal to some extent. However, it is quite difficult to reduce the offset voltage to a level that is equal to or less than a predetermined level while maintaining a gamma value adjustment within the target gamma curve. Improvement of the response speed of liquid crystal can also be achieved in part through optimization of a common voltage, which may introduce several other problems such as residual images, flickering, or the like. Limitations associated with developing alternative materials have been a barrier to changing to a different liquid crystal material.

Meanwhile, the voltage V typically applied to the liquid crystals for a time period corresponding to one frame may be expressed by the following formula:

$$V=Q/(Cst+Clc)$$

where the liquid crystal capacitance Clc is changed in the one frame due to an anisotropic dielectric constant while the amount Q of electric charge applied to the liquid crystals is constant based on the electric charge conservation law, so that the data voltage V applied to the liquid crystals is changed. That is to say, as the liquid crystal capacitance Clc is changed, the data voltage V applied to the pixel electrode is reduced, so that a cusp, or void, may occur. As a result, the response time becomes longer.

For example, it is assumed that a black state refers to a state in which the data voltage (4 V) is applied to the pixel electrode, a white state refers to a state in which the data voltage (0.5 V) is not applied to the pixel electrode, a value of the storage capacitor Cst is 0 when the pixel electrode is changed from the black state to the white state, a dielectric constant is 13.5 when the pixel electrode is in the black state, and a dielectric constant is 3.6 when the pixel electrode is in the white state. Based on the above assumptions, when the pixel electrode is in the black state, the amount Q of electric charge applied to the liquid crystals is 6.75, as calculated by the formula: Q=(Cst+Clc)*V. Since the amount Q of electric charge applied to the liquid crystals is maintained based on the electric charge conservation law, when the pixel electrode is in the white state, the voltage V applied to the liquid crystals is 1.875 V, as calculated by the formula {6.75=(0+3.6)*V}. Therefore, when the data voltage is not applied to the pixel electrode, the data voltage V that was applied to the pixel electrode is changed. In this case, the data voltage V is not 0.5 V but 1.875 V, that is, a gray state, suggesting formation or occurrence of a cusp. The cusp occurs at a boundary between the current frame and the next frame due to insufficient capacitance of the storage capacitor Cst.

SUMMARY OF THE INVENTION

One or more embodiments of the present invention provide a thin film transistor array panel that can improve the response speed of liquid crystal. The above and other objects of the present invention will be described in or will be apparent from the following description of the preferred embodiments.

According to an embodiment of the present invention, a thin film transistor (TFT) array panel includes a gate line and a data line insulated from each other on an insulating substrate where the gate line and the data line cross each other to define a pixel region, a thin film transistor (TFT) disposed at an intersection of the gate line and the data line, a floating electrode where at least a portion of the floating electrode overlaps the data line, and a pixel electrode disposed at the pixel region where the pixel electrode is connected to the TFT and overlaps the at least a portion of the floating electrode.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Figure 1:
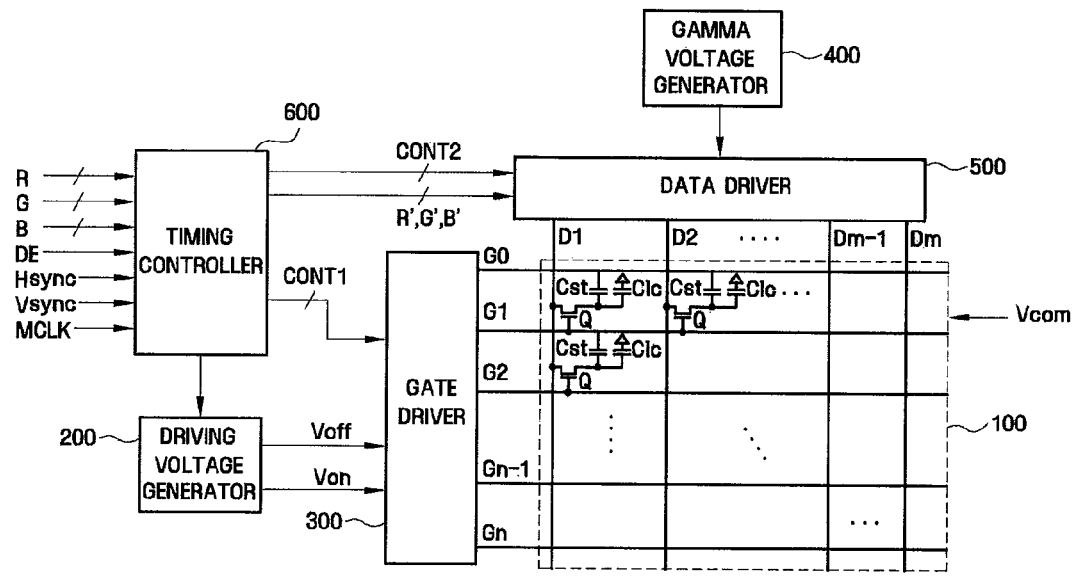
FIG. 1 is a block diagram of a liquid crystal display including a thin film transistor (TFT) array panel according to a first exemplary embodiment of the invention.

Advantages and features of the various embodiments of the present invention may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification. As used herein, the phrase exemplary embodiment is used to indicate an example and not necessarily an ideal embodiment. A liquid crystal display according to an exemplary embodiment of the invention will now be described more fully with reference to the accompanying drawings.

Figure 2:
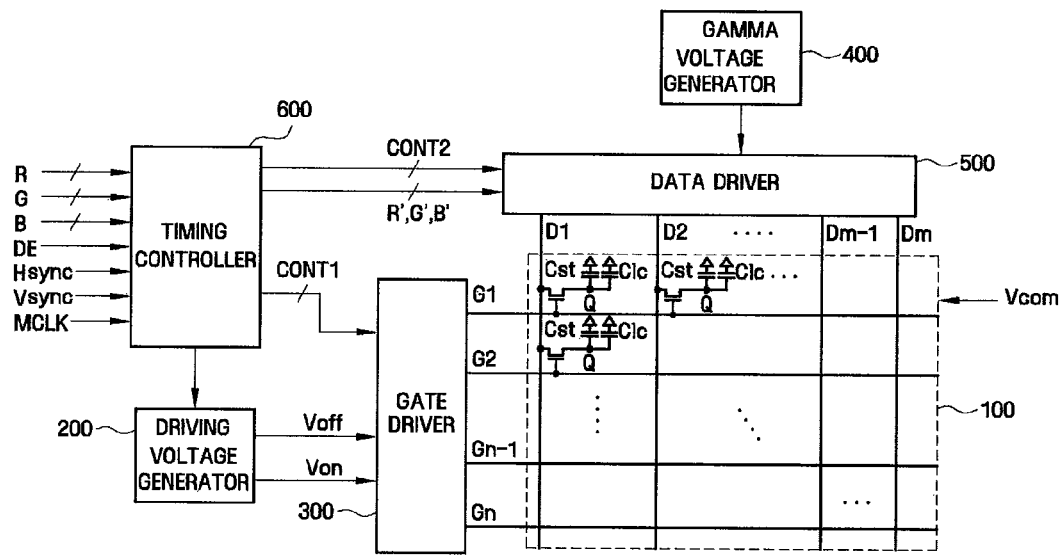
FIG. 2 is a block diagram of a liquid crystal display including a TFT array panel according to a second exemplary embodiment of the invention.

FIG. 1 is a block diagram of a liquid crystal display including a thin film transistor array panel according to a first exemplary embodiment of the invention, and FIG. 2 is a block diagram of a liquid crystal display including a thin film transistor array panel according to a second exemplary embodiment of the invention. Referring to FIGS. 1 and 2, the liquid crystal display according to the current embodiment of the invention includes a liquid crystal panel 100, a driving voltage generator 200, a gate driver 300, a gamma voltage generator 400, a data driver 500, and a timing controller 600.

In an equivalent circuital view shown in FIG. 1, the liquid crystal panel 100 includes a plurality of unit pixels connected to a plurality of display signal lines G1-Gn and D1-Dm and arranged substantially in a matrix arrangement. Here, the display signal lines G1-Gn and D1-Dm include a plurality of gate lines G1-Gn transmitting gate signals and a plurality of data lines D1-Dm transmitting data signals. The gate lines G1-Gn extend substantially in a row direction and are substantially parallel to each other, while the data lines D1-Dm extend substantially in a column direction and are substantially parallel to each other.

Each of the plurality of pixels consists of a switching element Q connected to a corresponding one of the plurality of display signal lines G1-Gn and D1-Dm, a liquid crystal capacitor Clc and a storage capacitor Cst connected to the switching element Q. Alternatively, the storage capacitor Cst may be omitted. The switching element Q is provided on a thin film transistor (TFT) substrate and has three terminals, a control terminal connected to one of the gate lines G1-Gn, an input terminal connected to one of the data lines D1-Dm, and an output terminal connected to both the liquid crystal capacitor Clc and the storage capacitor Cst. The liquid crystal capacitor Clc includes a pixel electrode provided on the TFT array panel and a common electrode provided on a color filter substrate as two terminals. The liquid crystal layer disposed between the two electrodes functions as a dielectric of the liquid crystal capacitor Clc. The pixel electrode is connected to the switching element Q and the common electrode is connected to the common voltage Vcom and covers the entire surface of the color filter substrate. Here, the common electrode may be provided on the TFT array panel. Alternatively, both of the pixel electrode and the common electrode may have shapes resembling bars or stripes.

As shown in FIGS. 1 and 2, the liquid crystal displays according to the first and second embodiments of the present invention have substantially the same configurations, except for the following. As shown in FIG. 1, the liquid crystal display including a TFT array panel according to the first embodiment of the present invention is a previous gate type LCD, in which a storage capacitor Cst is formed such that a pixel electrode overlaps an immediately preceding or previous gate line and a dielectric is disposed between the pixel electrode and the previous gate line. Here, since a pixel belonging to a first column has no previous gate line, a gate line G0 is added and a common voltage Vcom is applied to the gate line G0, thereby forming the storage capacitor Cst. As shown in FIG. 2, the liquid crystal display including a TFT array panel according to the first embodiment of the present invention is a separate wire type LCD, in which a storage capacitor Cst is formed such that a separate signal line provided on the TFT array panel overlaps a pixel electrode and a predetermined voltage, for example a common voltage Vcom, is applied to the separate signal line. In other words, the liquid crystal displays according to the first and second embodiments of the present invention are driven in substantially the same manner, except for storage capacitor formation methods.

For color display, each pixel can represent its own color by providing one of a plurality of red, green and blue color filters in an area corresponding to the pixel electrode. Here, the color filter is provided in the corresponding area of the color filter substrate. Alternatively, the color filters may be provided on or under the pixel electrode on the TFT array panel. One or more polarizers (not shown) may be attached to at least one of the TFT array panel and the color filter substrate of the liquid crystal panel 100 to transform light polarization into light transmittance.

The driving voltage generator 200 generates a plurality of driving voltages. For example, the driving voltage generator 200 generates a gate-on voltage Von, a gate-off voltage Voff, and a common voltage Vcom. The gate driver 300 is connected to the gate lines G1-Gn of the liquid crystal panel 100 and applies gate signals from an external device to the gate lines G1-Gn, each gate signal being a combination of a gate-on voltage Von and a gate-off voltage Voff. The gamma voltage generator 400 generates two sets of a plurality of gray voltages related to the transmittance of the pixels. The data voltages in one set have a positive polarity with respect to the common voltage Vcom, while those in the other set have a negative polarity with respect to the common voltage Vcom. The positive-polarity data voltages and negative-polarity data voltages are alternately supplied to the liquid crystal panel 100 during inversion driving. The data driver 500 is connected to the plurality of data lines D1-Dm of the liquid crystal panel 100. The data driver 500 generates gray voltages based on a plurality of voltages supplied from the gamma voltage generator 400, selects the generated gamma voltages, and applies the gamma voltages to each pixel as data signals. The data driver 500 typically includes a plurality of integrated circuits (ICs). The timing controller 600 generates control signals for controlling the gate driver 300, the data driver 500, and other components, and supplies the control signals to the corresponding components.

Figure 3:
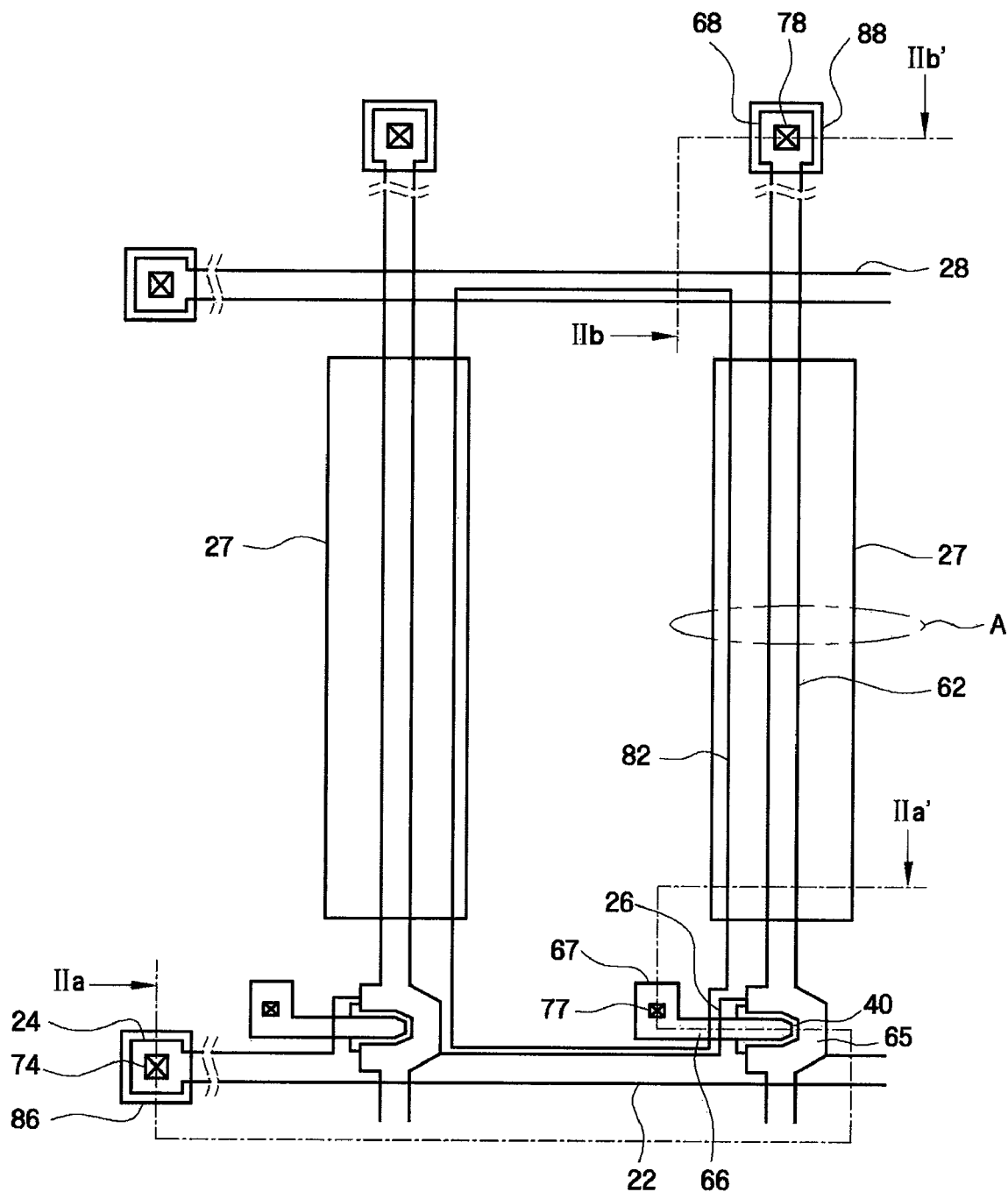
FIG. 3 is a layout view of an example of the TFT array panel used in the LCD shown in FIG. 1.
Figure 4:
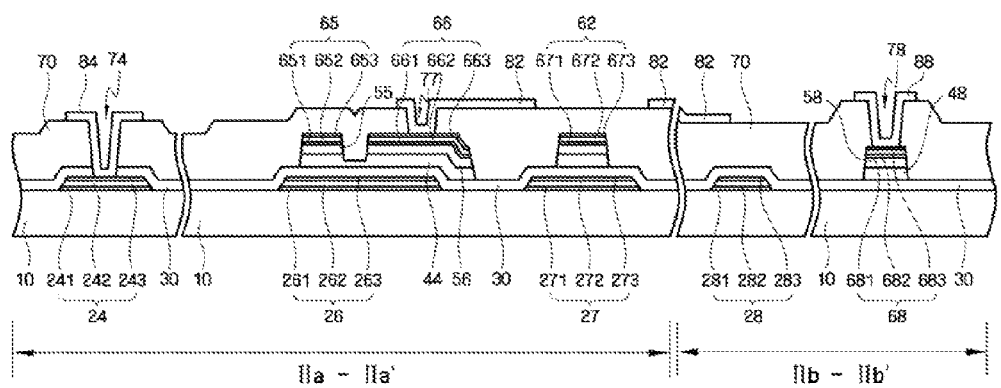
FIG. 4 is a sectional view of the TFT array panel shown in FIG. 3 taken along lines IIa-IIa' and IIb-IIb'.
Figure 5:
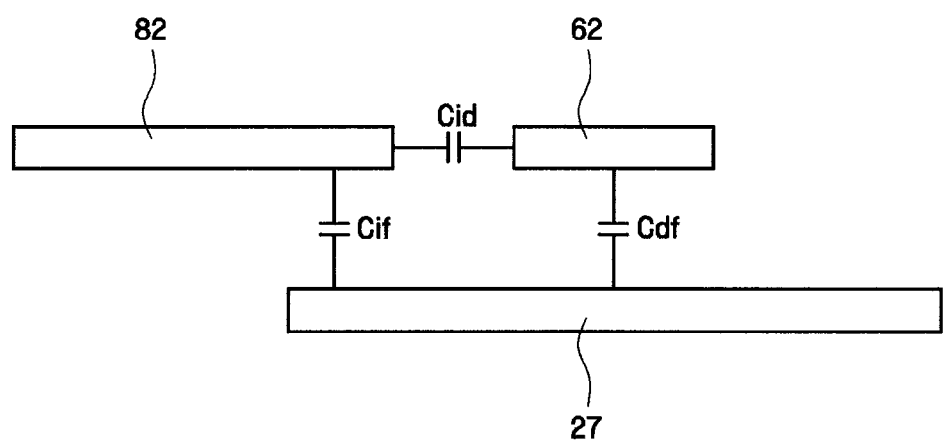
FIG. 5 is a cross-sectional view of a portion "A" shown in FIG. 3.
Figure 6:
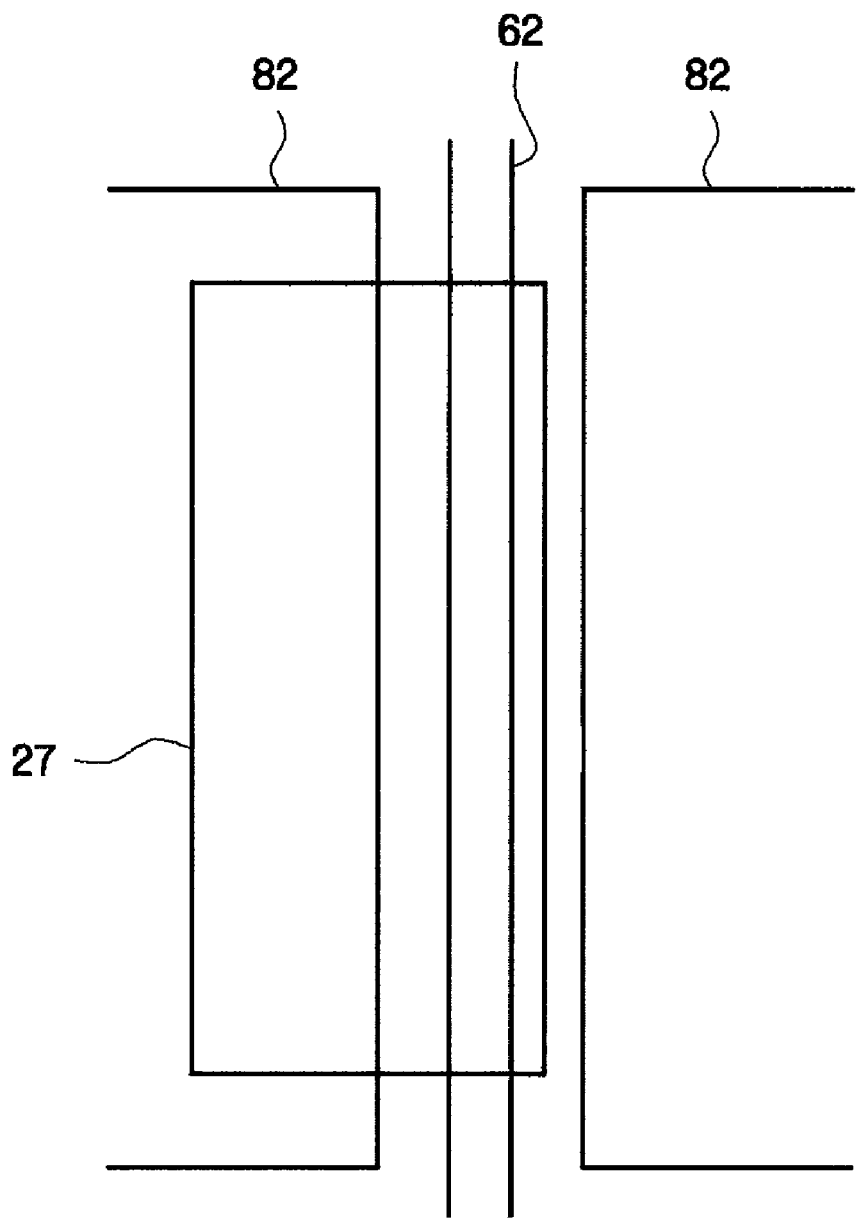
FIGS. 6 and 7 are diagrams illustrating data wires and pixel electrode arrangements of the TFT array panel shown in FIG. 3.
Figure 7:
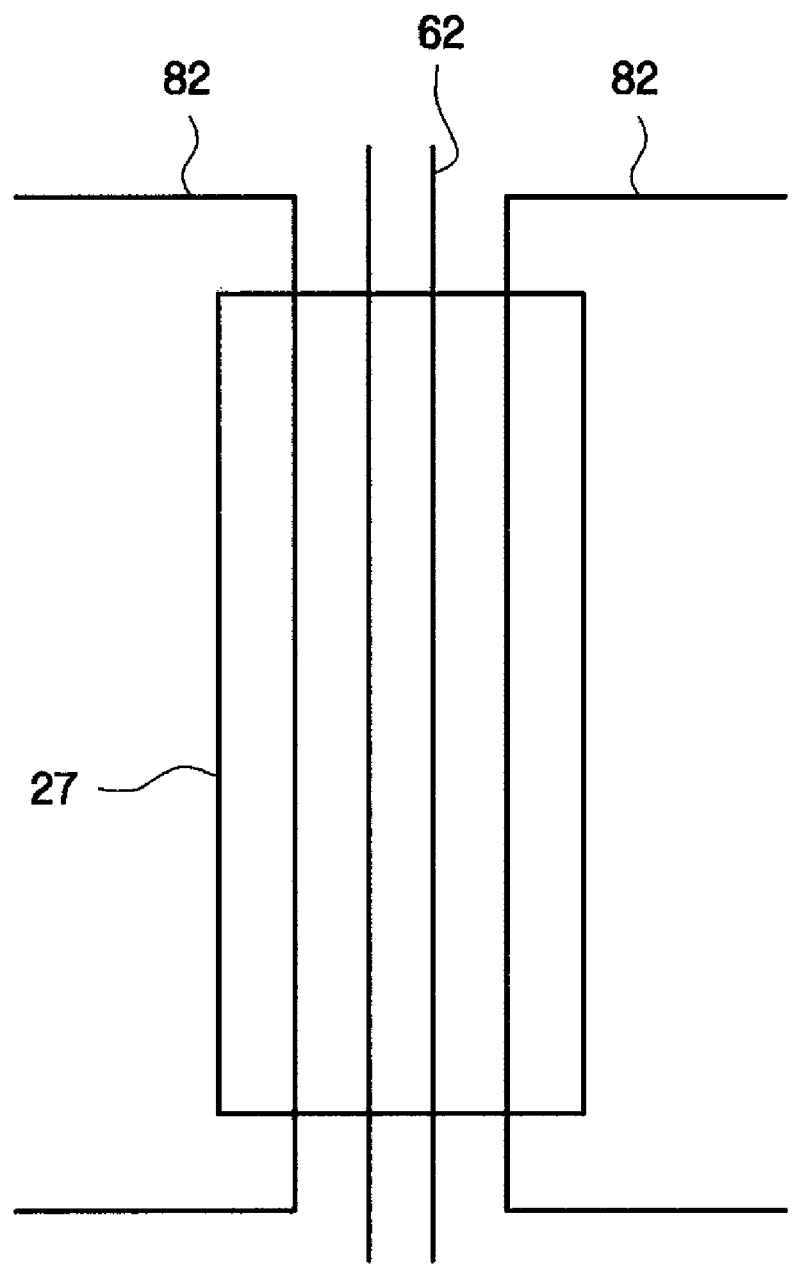
Figure 8:
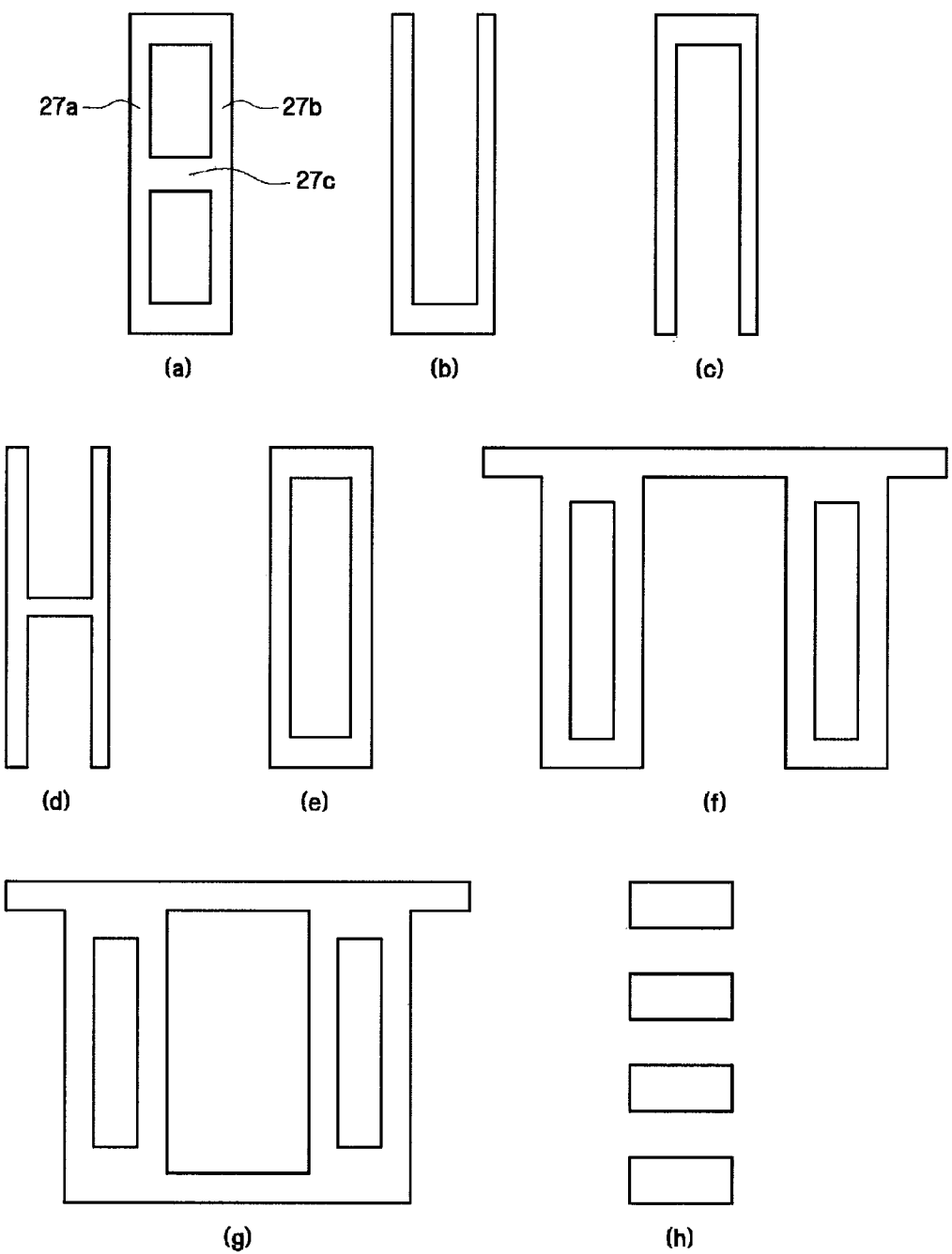
FIG. 8 illustrates plan views of modified floating electrodes of the TFT array panel shown in FIG. 3.

FIG. 3 is a layout view of an example of the TFT array panel used in the LCD shown in FIG. 1, FIG. 4 is a sectional view of the TFT array panel shown in FIG. 3 taken along lines IIa-IIa' and IIb-IIb'. FIG. 5 is a cross-sectional view of a portion "A" shown in FIG. 3. FIGS. 6 and 7 are diagrams illustrating data wires and pixel electrode arrangements of the TFT array panel shown in FIG. 3. FIG. 8 illustrates plan views of modified floating electrodes of the TFT array panel shown in FIG. 3. Referring to FIGS. 3 and 4, a plurality of gate wires (22, 24, 26, 28) responsible for transmission of gate signals are formed on an insulating substrate 10. The plurality of gate wires (22, 24, 26, 28) include a gate line 22 extending in a transverse direction, a gate pad 24 connected to an end of the gate line 22 to receive a gate signal from an external device and transmitting the same to the gate line 22, a gate electrode 26 of a TFT connected to the gate line 22 in the form of a protrusion, a storage electrode 28 formed in parallel with the gate line 22, and a floating electrode 27 formed between the gate line 22 and a preceding gate to be parallel with the gate line 22. The floating electrode 27 may alternatively be referred to as a floating gate 27. The storage electrode 28 overlaps a pixel electrode 82 to be described later to form a storage capacitor (Cst) which improves the charge retention capacity of a pixel. The shapes and arrangements of the storage electrode 28 may vary.

As shown in FIG. 4, the floating electrode 27 is formed on the same layer as the gate wires (22, 24, 26, 28) in a floating state, that is, in the absence of an electric field applied to the floating electrode 27, and is formed to be parallel with the data line 62 to at least partially overlap the data line 62. In addition, as indicated by a portion "A" shown in FIG. 3, at least a portion of the floating electrode 27 overlaps the data line 62 and the pixel electrode 82 to form first through third overlap capacitors Cid, Cif, and Cdf. As shown in FIG. 5, the first overlap capacitor Cid is formed between the pixel electrode 82 and the data line 62, the second overlap capacitor Cif is formed between the pixel electrode 82 and the floating electrode 27, and the third overlap capacitor Cdf is formed between the data line 62 and the floating electrode 27. In the current embodiment of the present invention, the floating electrode 27 is formed to overlap the data line 62 and pixel electrode 82. Accordingly, in addition to the storage capacitor Cst, the first through third overlap capacitors Cid, Cif, and Cdf are additionally provided, thereby increasing the capacitance of the storage capacitor Cst, which can be expressed in Formula (1) below:

$$Cst\_total = Cst + [Cid + (Cif \| Cdf)]$$

where the capacitance of the gate line 22 and the data line 62 changes depending on the areas of the electrodes and the distance between the electrodes, so that the capacitance of the third overlap capacitor Cdf formed between the gate line 22 and the data line 62 can be increased by increasing the area of the floating electrode 27.

If the capacitance of the overall storage capacitor Cst_total is increased in such a manner, that is, by increasing the capacitance of the third overlap capacitor Cdf, the response speed of liquid crystal is increased when a TFT is driven. That is to say, it is possible to increase the speed of charging the storage capacitor Cst when a data voltage is applied to the pixel electrode for one frame (white state) or the speed of discharging the storage capacitor Cst when no data voltage is applied to the pixel electrode for a next frame (black state). Accordingly, a delay in the response speed of liquid crystal due to a cusp occurring between the current frame and the next frame can be prevented, thereby improving the response speed of liquid crystal.

As shown in FIG. 3, the floating electrode 27 can be formed into a polygonal structure, that is having a polygonal shape. In addition, as shown in FIGS. 8(a) through 8(h), the floating electrode 27 can be formed into a wide variety of polygonal structures having at least one open portion overlapping the data line 62. Here, the floating electrode 27 includes first and second electrodes 27a and 27b with the data line 62 interposed therebetween. The first and second electrodes 27a and 27b are connected to each other by a coupling electrode 27c at least partially overlapping the data line 62. As shown in FIG. 6, the pixel electrode 82 is formed over the floating electrode 27 to at least partially overlap the floating gate 27 at one side of the data line 62. Alternatively, the pixel electrode 82 may be formed over the floating electrode 27 to at least partially overlap the floating gate 27 at both sides of the data line 62, as shown in FIG. 7.

The gate wire (22, 24, 26, 28) and the floating electrode 27 are preferably made of Al containing metal such as Al and Al alloy, Ag containing metal such as Ag and Ag alloy, Cu containing metal such as Cu and Cu alloy, Mo containing metal such as Mo and Mo alloy, Cr, Ti or Ta. In addition, the gate wire (22, 24, 26, 28), and the floating electrode 27 may have a multi-layered structure including two conductive films (not shown) having different physical characteristics. One of the two films is preferably made of a low resistivity metal including an Al containing metal, an Ag containing metal, and a Cu containing metal for reducing signal delay or voltage drop in the gate wire (22, 24, 26, 28), and the floating electrode 27. The other film is preferably made of material such as a Mo containing metal, Cr, Ta or Ti, which have good physical, chemical, and electrical contact characteristics with other materials such as indium tin oxide (ITO) or indium zinc oxide (IZO). Examples of combinations of the two films are a lower Cr film and an upper Al (alloy) film and a lower Al (alloy) film and an upper Mo (alloy) film. However, the gate wire (22, 24, 26, 28), and the floating electrode 27 may be made of various metals or conductors.

A gate insulating layer 30 is made of silicon nitride (SiNx) on the insulating substrate 10, the gate wire (22, 24, 26, 28), and the floating electrode 27. A semiconductor layer 44 is made of amorphous silicon hydride or polycrystalline silicon on the gate insulating layer 30 formed in an island shape. Ohmic contact layers 55 and 56 are made of silicide or n+ amorphous silicon hydride in which an n-type impurity is highly doped, on the semiconductor layer 44. A data wire (62, 65, 66, 67, 68) is formed on the ohmic contact layers 55 and 56 and the gate insulating layer 30. The data wire (62, 65, 66, 67, 68) includes a data line 62 extending in the longitudinal direction and crossing the gate line 22 to define a pixel region, a source electrode 65 branched from the data line 62 and extending onto an upper portion of the ohmic contact layer 55, a data pad 68 connected to an end of the data line 62 to receive an image signal from an external device, a drain electrode 66 separated from the source electrode 65 and extending onto an upper portion of the ohmic contact layer 56 located opposite to the source electrode 65 with respect to the gate electrode 26 or a channel portion of the TFT, and a drain extension portion 67 extending from the drain electrode 66 and overlapping the pixel electrode 82.

In the data wire (62, 65, 66, 67, 68), the data line 62, the source electrode 65, and the drain electrode 66 are preferably made of refractory metal such as Cr, a metal containing Mo, Ta, or Ti. The data line 62, the source electrode 65, and the drain electrode 66 may be formed in a multi-layered structure including a lower film (not shown) made of a lower refractory metal film and a low-resistivity upper film (not shown). Examples of the multi-layered structure include a double-layered structure having a lower Cr film and an upper Al (alloy) film, a double-layered structure having a lower Mo (alloy) film and an upper Al (alloy) film, and a triple-layered structure having a lower Mo film, an intermediate Al film, and an upper Mo film.

At least a portion of the source electrode 65 overlaps the semiconductor layer 44, and the drain electrode 66 is opposite to the source electrode 65 in view of the gate electrode 26 and its at least a portion overlaps with the semiconductor layer 44. Here, the ohmic contact layers 55 and 56 are interposed between the underlying semiconductor layer 44 and between the source electrode 65 and the drain electrode 66 to reduce the contact resistance between them. The drain expansion portion 67 overlaps the pixel electrode 82 to form a storage capacitor with the gate insulating layer 30 interposed therebetween.

The passivation layer 70 is formed on the data wire (62, 65, 66, 67, 68) and the semiconductor layer 44 that is not covered thereby. The passivation layer 70 is preferably made of a photosensitive organic material having a good flatness characteristic, a low dielectric insulating material such as a-Si:C:O and a-Si:O:F formed by plasma enhanced chemical vapor deposition (PECVD), or an inorganic insulator such as silicon nitride (SiNx). When the passivation layer 70 is made of an organic material, an insulation layer (not shown) made of silicon nitride (SiNx) or silicon oxide ($SiO_2$) may further be provided under an exposed portion of the semiconductor layer 44 in order to prevent an organic material of the passivation layer 70 from contacting the exposed portion of the semiconductor layer 44 between the source electrode 65 and the drain electrode 66.

The passivation layer 70 has contact holes 77 and 78 exposing the drain expansion portion 67 and the data pad 68, respectively. A contact hole 74 exposing the gate pad 24 is formed through the passivation layer 70 and the gate insulating layer 30. On the passivation layer 70 is formed the pixel electrode 82 electrically connected to the drain electrode 66 and positioned at the pixel. Electric fields are generated between the pixel electrode 82 supplied with the data voltages and a common electrode of an upper panel, which determine an orientation of liquid crystal molecules in the liquid crystal layer between the pixel electrode 82 and the common electrode. An auxiliary gate pad 84 and an auxiliary data pad 88 connected to the gate pad 24 and the data line pad 68 via the contact holes 74 and 78, respectively, are also disposed on the passivation layer 70. The pixel electrode 82, the auxiliary gate pad 84, and the auxiliary data pad 88 are made of indium tin oxide (ITO).

Figure 9:
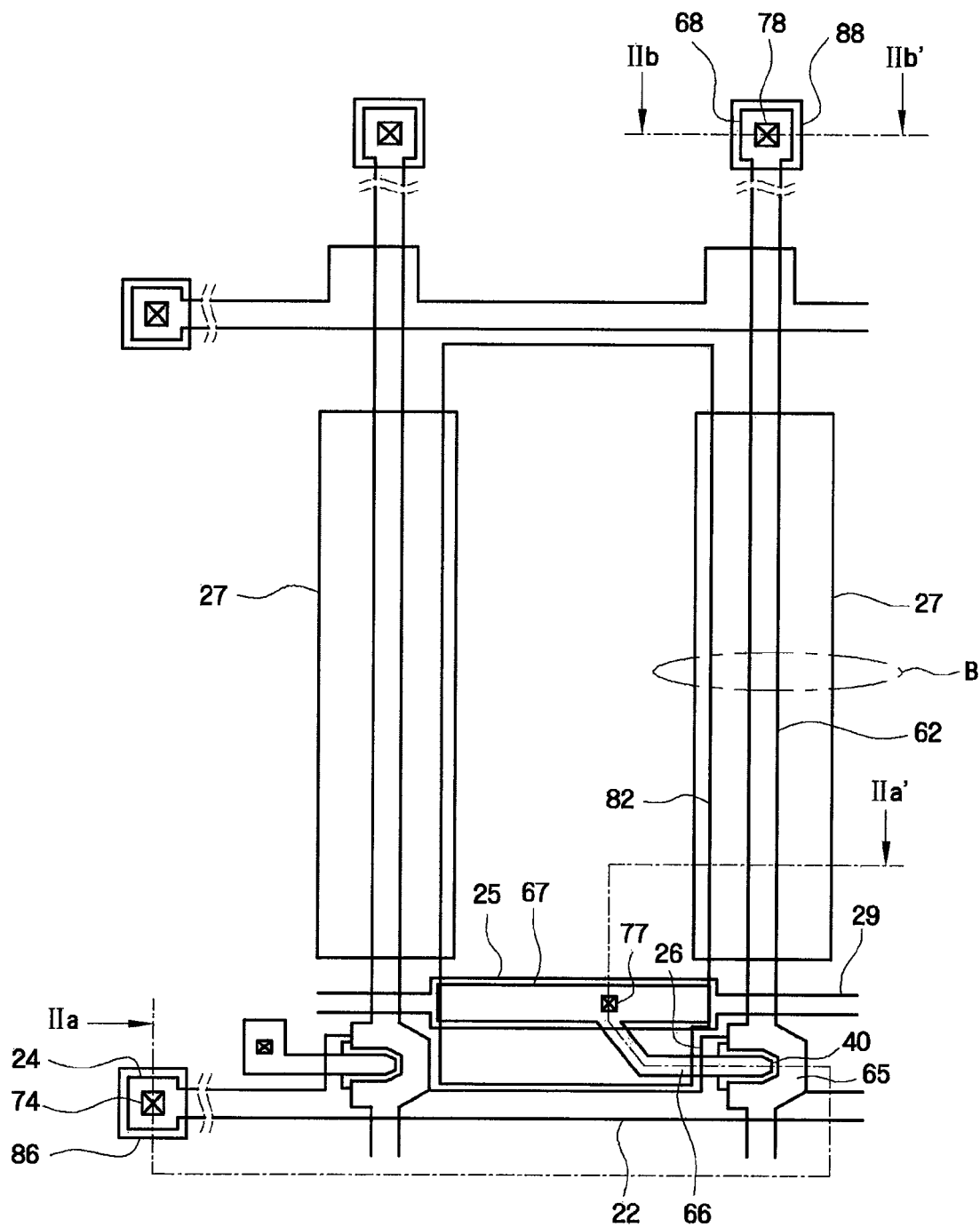
FIG. 9 is a layout view of an example of the TFT array panel used in the LCD shown in FIG. 2.
Figure 10:
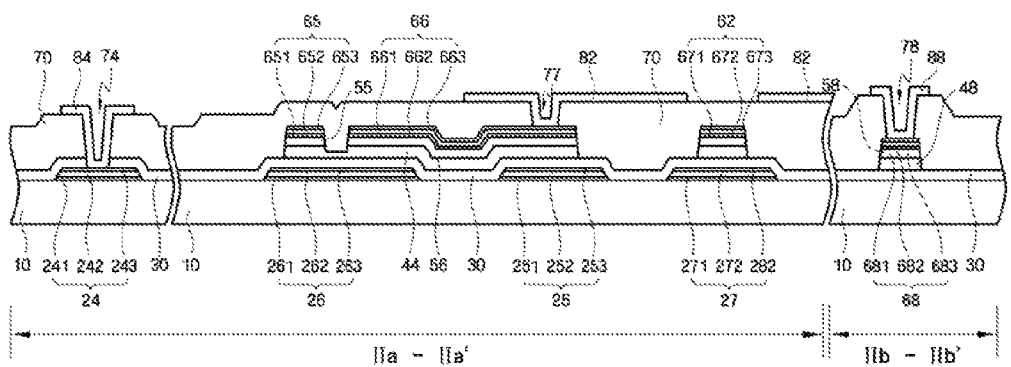
FIG. 10 is a sectional view of the TFT array panel shown in FIG. 9 taken along lines IIa-IIa' and IIb-IIb'.

FIG. 9 is a layout view of an example of the TFT array panel used in the LCD shown in FIG. 2 and FIG. 10 is a sectional view of the TFT array panel shown in FIG. 9 taken along lines IIa-IIa' and IIb-IIb'. The TFT array panel according to the current exemplary embodiment has substantially the same structure as the TFT array panel according to the first exemplary embodiment illustrated in FIG. 3 except that a separate storage electrode line 29 used to form a storage capacitor Cst is formed, and, for brevity, repetitive descriptions thereabout will not be given. Referring to FIGS. 9 and 10, the storage capacitor Cst is formed such that the storage electrode 25 of a separate storage electrode line 29 provided in a TFT array panel 10 overlaps a pixel electrode 82 and a predetermined voltage, for example a common voltage Vcom, is applied to the separate storage electrode line 29, which is referred to as a separate wire type.

As shown in FIG. 10, a floating gate 27 is formed on the same layer as the gate wires (22, 24, 26, 28) in a floating state, that is, in the absence of an electric field applied to the floating electrode 27, and is formed to be parallel with the data line 62 to at least partially overlap the data line 62. In addition, as indicated by a portion "B" shown in FIG. 9, at least a portion of the floating electrode 27 overlaps the data line 62 and the pixel electrode 82 to form first through third overlap capacitors Cid, Cif, and Cdf. As shown in FIG. 5, the first overlap capacitor Cid is formed between the pixel electrode 82 and the data line 62, the second overlap capacitor Cif is formed between the pixel electrode 82 and the floating electrode 27, and the third overlap capacitor Cdf is formed between the gate line 22 and the data line 62. Here, since the capacitance of the gate line 22 and the data line 62 changes depending on the areas of the electrodes and the distance between the electrodes, the capacitance of the third overlap capacitor Cdf formed between the gate line 22 and the data line 62 can be increased by increasing the area of the floating electrode 27.

If the capacitance of the overall storage capacitor Cst_total is increased in such a manner, that is, by increasing the capacitance of the third overlap capacitor Cdf, the response speed of liquid crystal is increased when a TFT is driven. That is to say, it is possible to increase the speed of charging the storage capacitor Cst when a data voltage is applied to the pixel electrode for one frame (white state) or the speed of discharging the storage capacitor Cst when no data voltage is applied to the pixel electrode for a next frame (black state). Accordingly, a delay in the response speed of liquid crystal due to a cusp occurring between the current frame and the next frame can be prevented, thereby improving the response speed of liquid crystal. Therefore, according to the current embodiment, the same effect as in the first embodiment can be achieved.

As shown in FIG. 9, the floating electrode 27 can be formed into a polygonal structure. In addition, as shown in FIGS. 8(a) through 8(h), the floating electrode 27 can be formed into a wide variety of polygonal structures having at least one open portion overlapping the data line 62. Here, the floating electrode 27 includes first and second electrodes 27a and 27b with the data line 62 interposed therebetween. The first and second electrodes 27a and 27b are connected to each other by a coupling electrode 27c at least partially overlapping the data line 62. As shown in FIG. 6, the pixel electrode 82 is formed over the floating electrode 27 to at least partially overlap the floating gate 27 at one side of the data line 62. Alternatively, the pixel electrode 82 may be formed over the floating electrode 27 to at least partially overlap the floating gate 27 at both sides of the data line 62, as shown in FIG. 7.

Figure 11:
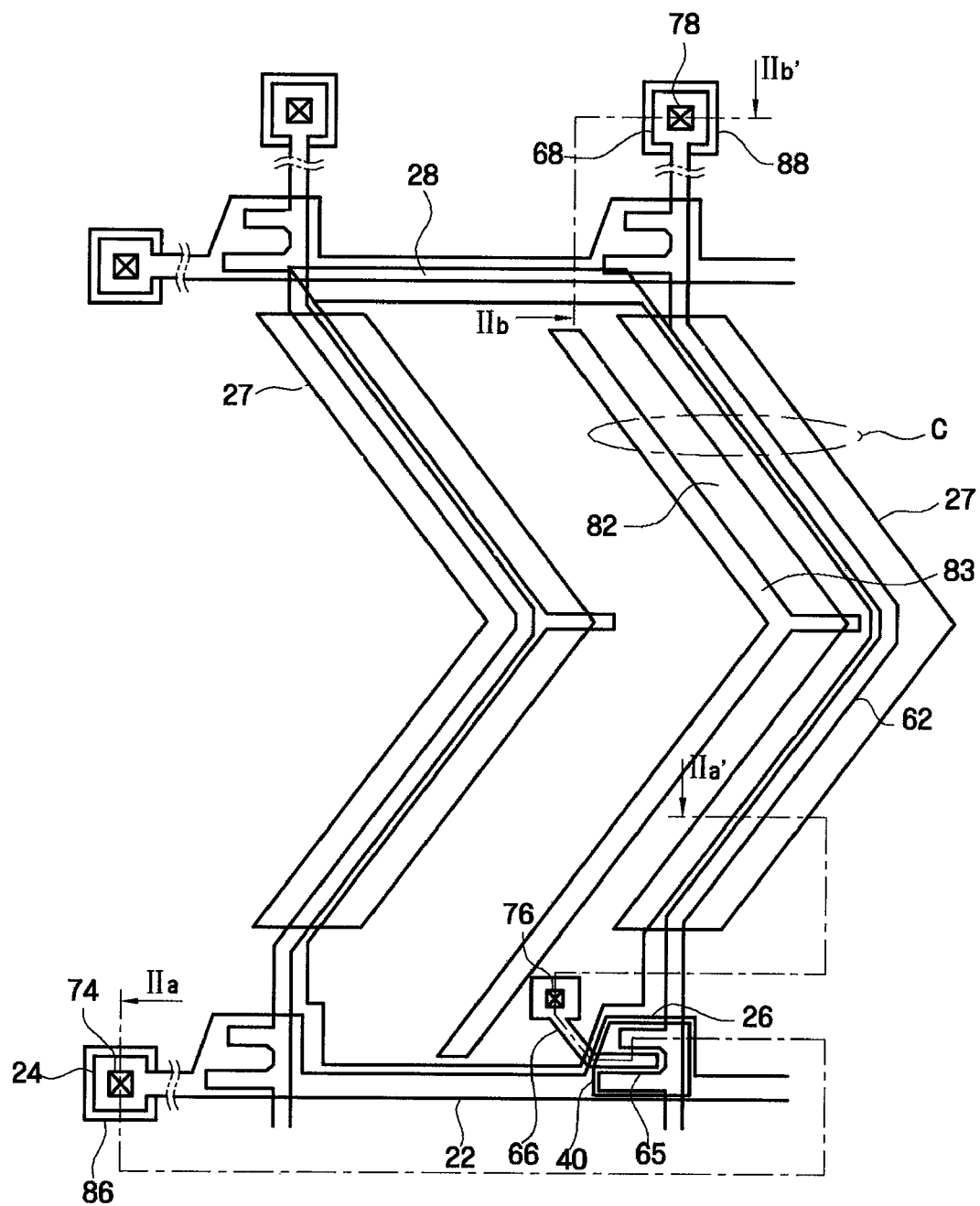
FIG. 11 is a layout view of a liquid crystal display including a TFT array panel according to a third exemplary embodiment of the invention.
Figure 12:
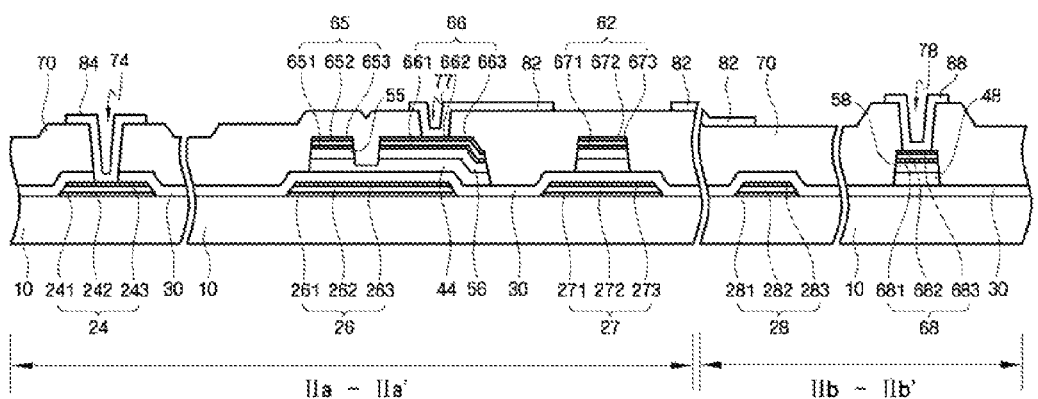
FIG. 12 is a sectional view of the TFT array panel shown in FIG. 11 taken along lines IIa-IIa' and IIb-IIb'.
Figure 13:
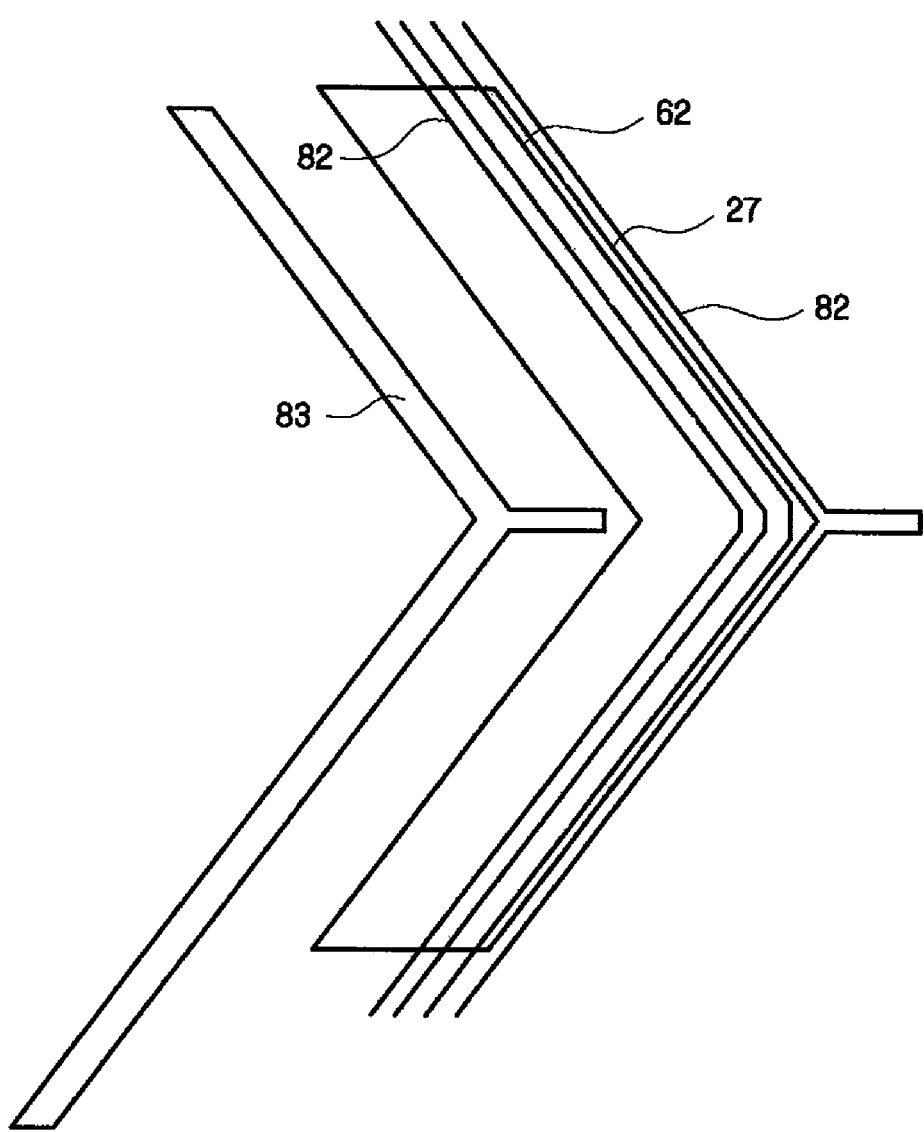
FIGS. 13 and 14 are diagrams illustrating data wires and pixel electrode arrangements of the TFT array panel shown in FIG. 11.
Figure 14:
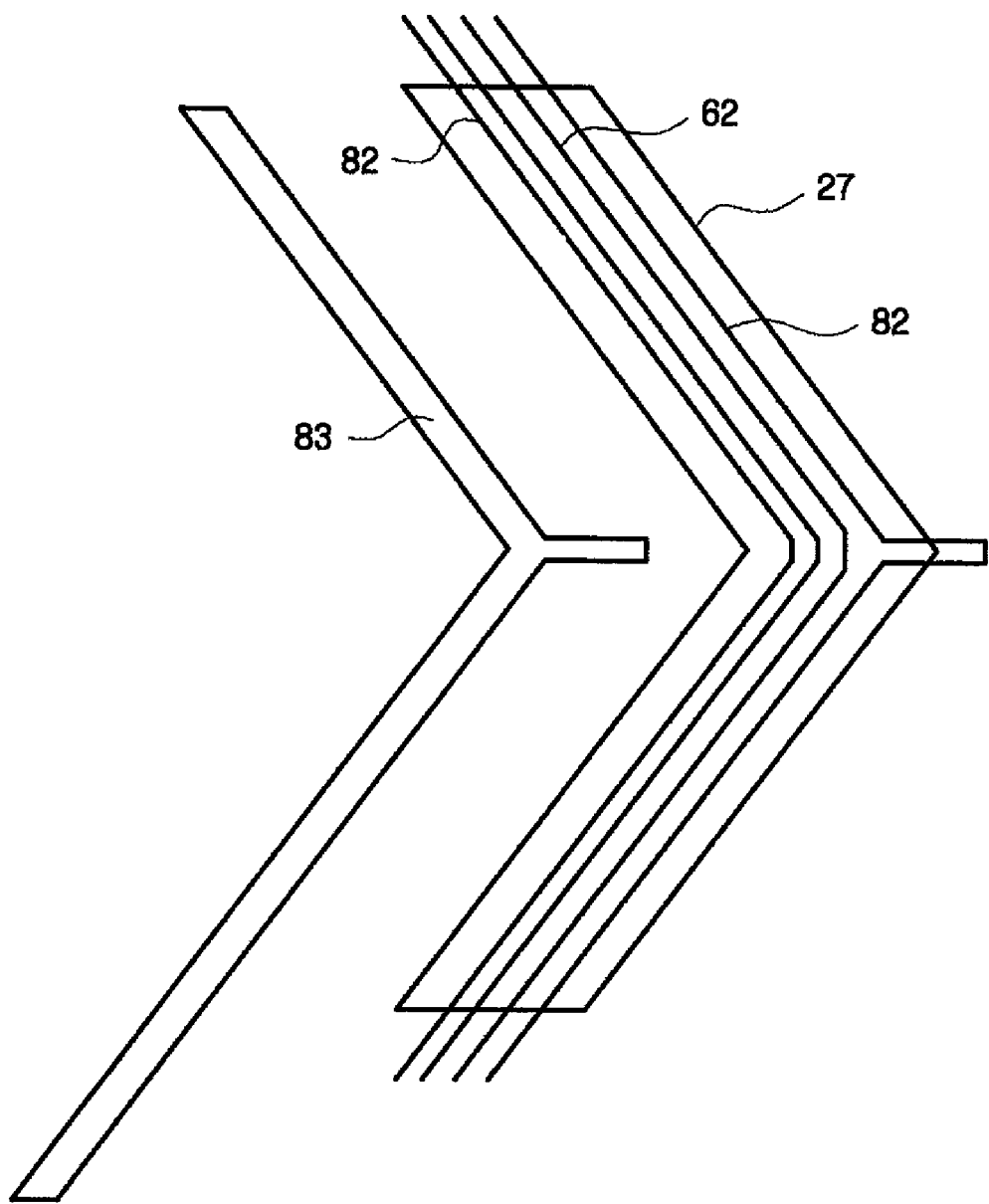
Figure 15:
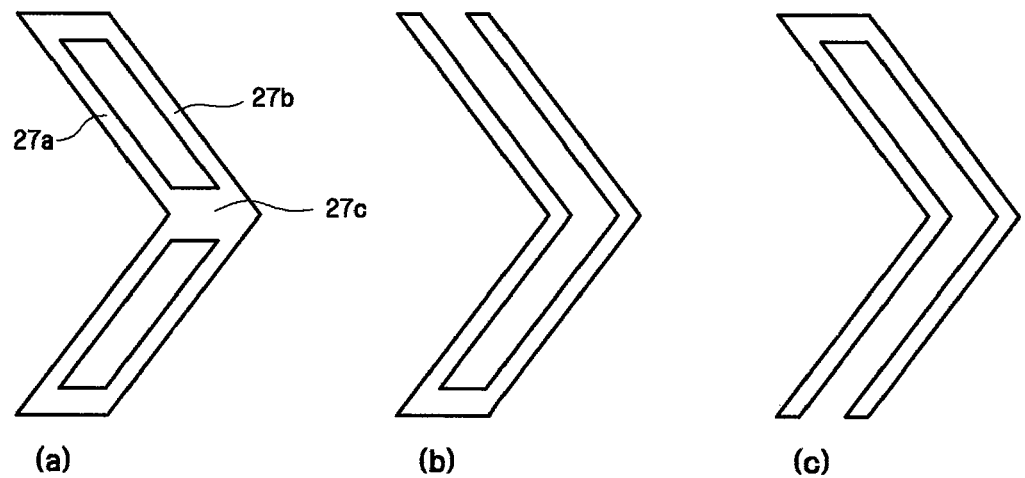
FIG. 15 illustrates plan views of modified floating electrodes of the TFT array panel shown in FIG. 11.
Figure 15:
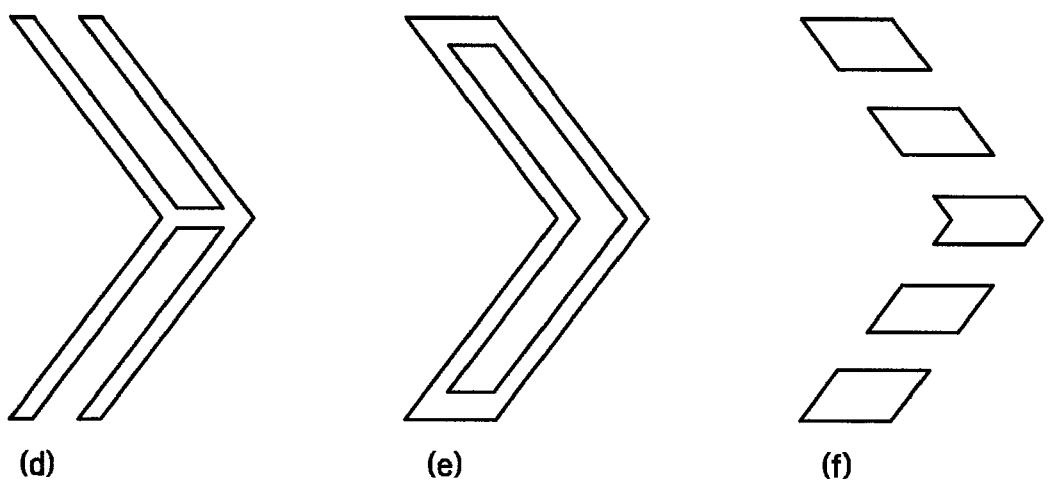

Next, a TFT array panel according to a third embodiment of the invention will be described with reference to FIGS. 11 through 15. FIG. 11 is a layout view of a liquid crystal display including a TFT array panel according to a third exemplary embodiment of the invention, FIG. 12 is a sectional view of the TFT array panel shown in FIG. 11 taken along lines IIa-IIa' and IIb-IIb', FIGS. 13 and 14 are diagrams illustrating data wires and pixel electrode arrangements of the TFT array panel shown in FIG. 11, and FIG. 15 illustrates plan views of modified floating electrodes of the TFT array panel shown in FIG. 11. The TFT array panel according to the third embodiment has substantially the same structure as the TFT array panel according to the first embodiment illustrated in FIG. 3 except that a pixel electrode overlaps a directly previous, or immediately preceding, gate line 28 used to form a storage capacitor Cst and the shape of a floating electrode 27 is modified according to the pattern of a pixel electrode 82 and the arrangement of a data line 62, and, for brevity, repetitive descriptions thereabout will not be given.

Referring to FIGS. 11 and 12, the storage capacitor Cst is formed by a previous gate type connection method in which the pixel electrode 82 overlaps the immediately previous, or immediately preceding, gate line and a dielectric is disposed between the pixel electrode and the previous gate line. Here, since a pixel belonging to a first column has no previous gate line, a gate line G0 is added and a common voltage Vcom is applied to the gate line G0, thereby forming the storage capacitor Cst. The pixel electrode 82 includes a first pixel electrode (not shown) and a second pixel electrode (not shown) separated by a cutout 83 formed parallel to the data line 62. Here, the first and second pixel electrodes are electrically connected to each other. A protrusion may be formed at a location where the cutout 83 is formed. The cutout 83 or the protrusion may be called a domain divider. The cutout 83 divides a pixel region in a longitudinal direction substantially in a ratio of 1:2 and forms an angle of about 45 degrees or −45 degrees with the gate line 22. Here, the first pixel electrode may be formed at either left or right side of the cutout 83. The first pixel electrode may comprise a plurality of trapezoidal electrode elements. Here, the cutout 83 preferably has a width in the range of 9 μm (micrometer) to 12 μm. However, in a case where the protrusion, rather than the cutout 83, is formed as the domain divider, the protrusion preferably has a width in the range of 5 μm to 10 μm.

The data line 62 is formed such that a bend and a longitudinal portion appear periodically along the length of a pixel. Here, the bend of the data line 62 includes two oblique portions; one forming an angle of about 45 degrees with the gate line 22; and the other forming an angle of about −45 degrees with the gate line 22. A source electrode 65 is connected to the longitudinal portion of the data line 62. In the data line 62, a length ratio of the bend to the longitudinal portion is preferably in a range between about 1:1 and about 9:1. The pixel region defined by the gate line 22 and the data line 62 crossing each other is shaped in a bent stripe. As described above, the data line 62 may be shaped in a combination of a bar and a bent stripe, like the pixel, but the invention is not limited to the illustrated example. That is, a data line may also be shaped simply in the form of a bar or a bent stripe.

The floating gate 27 is formed on the same layer as the gate wires (22, 24, 26, 28) in a floating state, that is, in the absence of an electric field applied to the floating electrode 27, and is formed to at least partially overlap the data line 62. In addition, as indicated by a portion "C" shown in FIG. 11, at least a portion of the floating electrode 27 overlaps the data line 62 and the pixel electrode 82 to form first through third overlap capacitors Cid, Cif, and Cdf. As shown in FIG. 5, the first overlap capacitor Cid is formed between the pixel electrode 82 and the data line 62, the second overlap capacitor Cif is formed between the pixel electrode 82 and the floating electrode 27, and the third overlap capacitor Cdf is formed between the data line 62 and the floating electrode 27. Here, since the capacitance of the gate line 22 and the data line 62 changes depending on the areas of the electrodes and the distance between the electrodes, the capacitance of the third overlap capacitor Cdf formed between the data line 62 and the floating electrode 27 can be increased by increasing the area of the floating electrode 27.

If the capacitance of the overall storage capacitor Cst_total is increased in such a manner, that is, by increasing the capacitance of the third overlap capacitor Cdf, the response speed of liquid crystal is increased when a TFT is driven. That is to say, it is possible to increase the speed of charging the storage capacitor Cst when a data voltage is applied to the pixel electrode for one frame (white state) or the speed of discharging the storage capacitor Cst when no data voltage is applied to the pixel electrode for a next frame (black state). Accordingly, a delay in the response speed of liquid crystal due to a cusp occurring between the current frame and the next frame can be prevented, thereby improving the response speed of liquid crystal. Therefore, according to the current embodiment, the same effect as in the first embodiment can be achieved.

As shown in FIG. 11, the floating electrode 27 can be formed into a polygonal structure shaped in a combination of a bar and a bent stripe, like the data line 62. In addition, as shown in FIGS. 15(*a*) through 15(*f*), the floating electrode 27 can be formed into a wide variety of polygonal structures having at least one open portion overlapping the data line 62 shaped in a combination of a bar and a bent stripe. Here, the floating electrode 27 includes first and second electrodes 27a and 27b with the data line 62 interposed therebetween. The first and second electrodes 27a and 27b are connected to each other by a coupling electrode 27c at least partially overlapping the data line 62.

Figure 16:
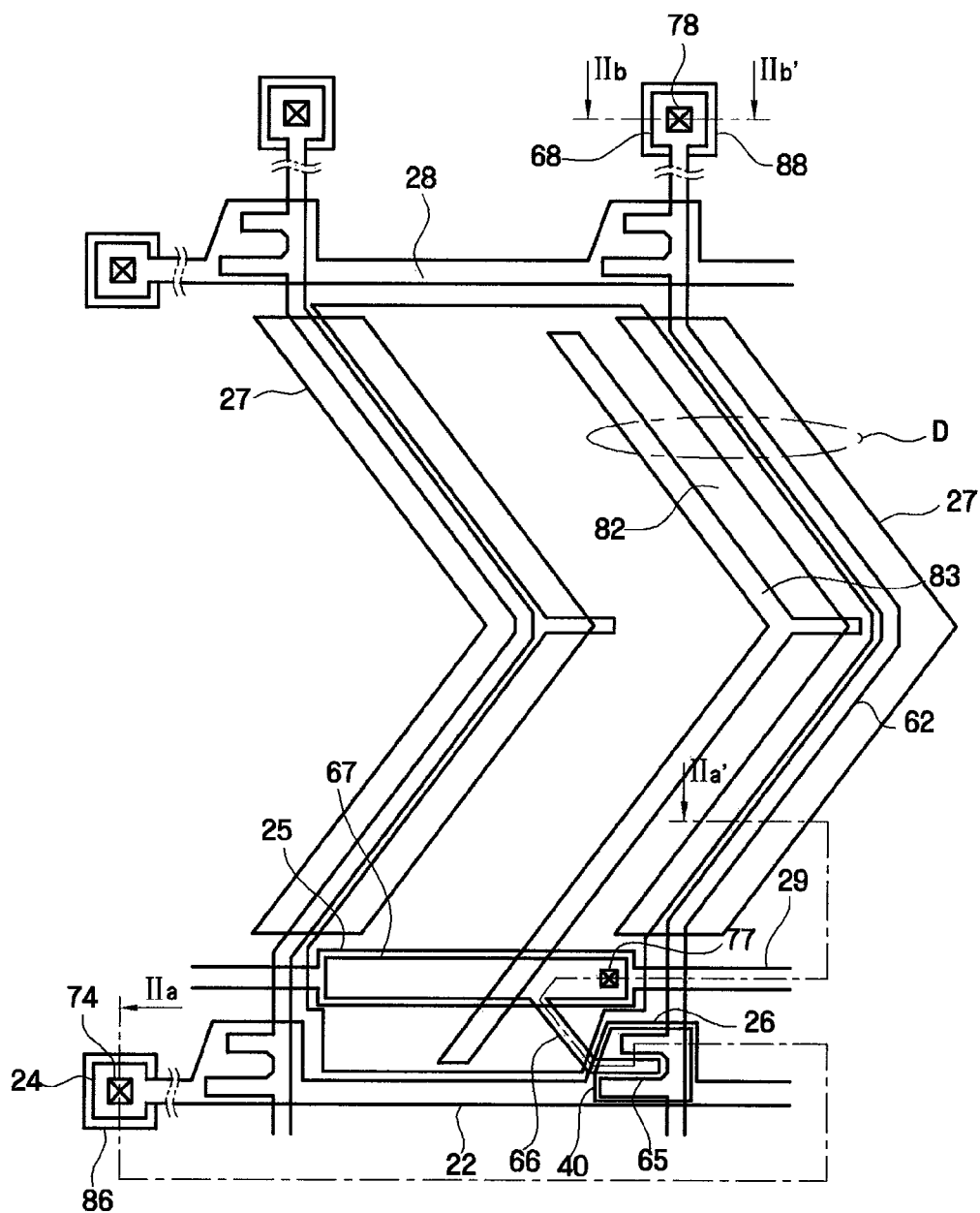
FIG. 16 is a layout view of a liquid crystal display including a TFT array panel according to a fourth exemplary embodiment of the invention.
Figure 17:
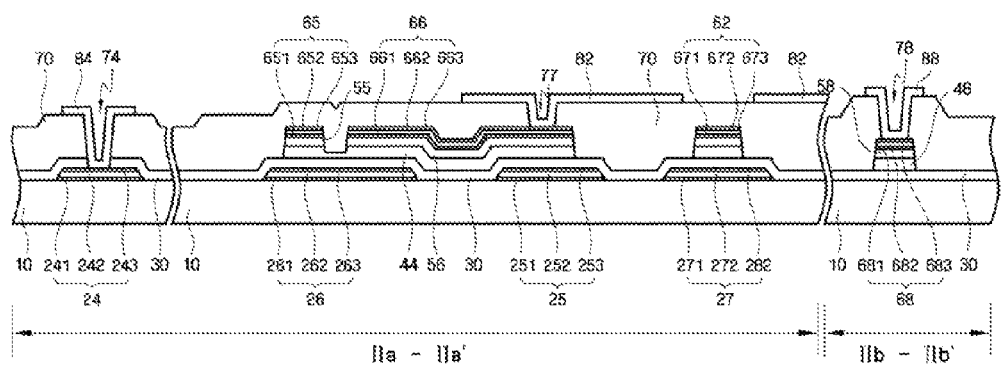
FIG. 17 is a sectional view of the TFT array panel shown in FIG. 16 taken along lines IIa-IIa' and IIb-IIb'.

As shown in FIG. 13, the pixel electrode 82 is formed over the floating electrode 27 to at least partially overlap the floating gate 27 at one side of the data line 62. Alternatively, the pixel electrode 82 may be formed over the floating electrode 27 to at least partially overlap the floating gate 27 at both sides of the data line 62, as shown in FIG. 14. FIG. 16 is a layout view of a liquid crystal display including a TFT array panel according to a fourth exemplary embodiment of the invention, and FIG. 17 is a sectional view of the TFT array panel shown in FIG. 16 taken along lines IIa-IIa' and IIb-IIb'. The TFT array panel according to the fourth embodiment has substantially the same structure as the TFT array panel according to the third embodiment illustrated in FIG. 11 except that a separate storage electrode line 29 forms a storage capacitor Cst and, for brevity, repetitive descriptions thereabout will not be given. Referring to FIGS. 16 and 17, the storage capacitor Cst is formed such that the separate storage electrode line 29 provided in a TFT array panel 10 overlaps a pixel electrode 82 and a predetermined voltage, for example a common voltage Vcom, is applied to the separate storage electrode line 29, which is referred to as a separate wire type.

As shown in FIG. 17, a floating gate 27 is formed on the same layer as the gate wires (22, 24, 26, 28) in a floating state, that is, in the absence of an electric field applied to the floating electrode 27, and is formed to at least partially overlap the data line 62. In addition, as indicated by a portion "D" shown in FIG. 16, at least a portion of the floating electrode 27 overlaps the data line 62 and the pixel electrode 82 to form first through third overlap capacitors Cid, Cif, and Cdf. As shown in FIG. 5, the first overlap capacitor Cid is formed between the pixel electrode 82 and the data line 62, the second overlap capacitor Cif is formed between the pixel electrode 82 and the floating electrode 27, and the third overlap capacitor Cdf is formed between the gate line 22 and the data line 62. Here, since the capacitance of the gate line 22 and the data line 62 changes depending on the areas of the electrodes and the distance between the electrodes, the capacitance of the third overlap capacitor Cdf formed between the gate line 22 and the data line 62 can be increased by increasing the area of the floating electrode 27.

If the capacitance of the overall storage capacitor Cst_total is increased in such a manner, that is, by increasing the capacitance of the third overlap capacitor Cdf, the response speed of liquid crystal is increased when a TFT is driven. That is to say, it is possible to increase the speed of charging the storage capacitor Cst when a data voltage is applied to the pixel electrode for one frame (white state) or the speed of discharging the storage capacitor Cst when no data voltage is applied to the pixel electrode for a next frame (black state). Accordingly, a delay in the response speed of liquid crystal due to a cusp occurring between the current frame and the next frame can be prevented, thereby improving the response speed of liquid crystal. Therefore, according to the current embodiment, the same effect as in the third embodiment can be achieved.

As shown in FIG. 16, the floating electrode 27 can be formed into a polygonal structure. In addition, as shown in FIGS. 15(*a*) through 15(*f*), the floating electrode 27 can be formed into a wide variety of polygonal structures having at least one open portion overlapping the data line 62. Here, the floating electrode 27 includes first and second electrodes 27*a* and 27*b* with the data line 62 interposed therebetween. The first and second electrodes 27*a* and 27*b* are connected to each other by a coupling electrode 27*c* at least partially overlapping the data line 62. As shown in FIG. 13, the pixel electrode 82 is formed over the floating electrode 27 to at least partially overlap the floating gate 27 at one side of the data line 62. Alternatively, the pixel electrode 82 may be formed over the floating electrode 27 to at least partially overlap the floating gate 27 at both sides of the data line 62, as shown in FIG. 14.

In addition, according to the present invention, vertical streaks, which are observed by local deviation due to the non-linear construction of an aligner, or aligning member, can be prevented. That is to say, in performing a patterning step to form a pixel electrode, the pixel electrode may slightly deviate by a predetermined gap due to the non-linear construction of an aligner, resulting in creation of vertical streaks. In this instance, the vertical streaks can be removed, or avoided, by increasing the capacitance of an overlap capacitor Cid formed between a data line and the pixel electrode. As described above, in the TFT array panel according to the present invention, the response speed of liquid crystal can be improved by increasing the capacitance of a storage capacitor having a floating electrode overlapping a data line. While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A thin film transistor (TFT) array panel, comprising:
   at least one gate line and at least one data line insulated from each other on an insulating substrate;
   at least two pixel electrodes;
   at least one thin film transistor (TFT) including a gate electrode, a source electrode and a drain electrode respectively, wherein the gate electrode is connected to the gate line, the source electrode is connected to the data line, and the drain electrode is connected to one of the pixel electrodes; and
   a capacitive electrode, at least a portion of the capacitive electrode overlapping the data line, wherein the capacitive electrode overlaps the pixel electrodes, and the capacitive electrode is without an opening or a slit facing the data line; and
   an ohmic contact layer disposed between the data line and the capacitive electrode, wherein a width of the ohmic contact layer is larger than a width of the data line;
   wherein one of the pixel electrodes is disposed in a first pixel region and another one of the pixel electrodes is disposed in a second pixel region.

2. The TFT array panel of claim 1, wherein the capacitive electrode is disposed parallel to the data line so that the at least a portion of the capacitive electrode overlaps the data line.

3. The TFT array panel of claim 1, wherein the capacitive electrode is disposed on the same layer as the gate line.

4. The TFT array panel of claim 1, wherein the pixel electrode overlaps an immediately preceding second gate line adjacent to the gate line to form a storage capacitor.

5. The TFT array panel of claim 4, wherein the capacitive electrode partially overlaps at least one side of each of the pixel electrodes.

6. The TFT array panel of claim 4, wherein the capacitive electrode is formed into a polygonal structure.

7. The TFT array panel of claim 4, wherein the capacitive electrode is disposed vertically between the gate lines.

8. The TFT array panel of claim 1, wherein at least a portion of the pixel electrode overlaps a separate storage electrode to form a storage capacitor.

9. The TFT array panel of claim 8, wherein the pixel electrode is disposed over the capacitive electrode to at least partially overlap the capacitive electrode at one side of the data line.

10. The TFT array panel of claim 8, wherein the pixel electrode is disposed over the capacitive electrode to at least partially overlap the floating electrode at both sides of the data line.

11. The TFT array panel of claim 8, wherein the capacitive electrode is formed into a polygonal structure.

12. The TFT array panel of claim 8, wherein the capacitive electrode includes first and second electrodes with the data line interposed therebetween, the first and second electrodes being connected to each other by a coupling electrode that is at least partially overlapping the data line.

13. The TFT array panel of claim 1, wherein a width of an overlap between the capacitive electrode and a first pixel electrode is substantially equal to a width of an overlap between the capacitive electrode and a second pixel electrode adjacent to the first pixel electrode.

14. The TFT array panel of claim 1, wherein the capacitive electrode is divided into first and second portions which do not overlap the data line, and wherein the first and second portions are generally symmetric with respect to the data line.

* * * * *